United States Patent
Shida et al.

(10) Patent No.: US 12,262,571 B2
(45) Date of Patent: Mar. 25, 2025

(54) TRANSPARENT ELECTRODE, PROCESS FOR PRODUCING TRANSPARENT ELECTRODE, AND PHOTOELECTRIC CONVERSION DEVICE COMPRISING TRANSPARENT ELECTRODE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Naomi Shida, Minato (JP); Katsuyuki Naito, Bunkyo (JP); Yutaka Saita, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 627 days.

(21) Appl. No.: 17/469,723

(22) Filed: Sep. 8, 2021

(65) Prior Publication Data

US 2022/0209151 A1 Jun. 30, 2022

Related U.S. Application Data

(63) Continuation of application No. PCT/JP2020/008695, filed on Mar. 2, 2020.

(51) Int. Cl.
*H01L 51/44* (2006.01)
*G03F 7/023* (2006.01)
(Continued)

(52) U.S. Cl.
CPC ............ *H10K 30/82* (2023.02); *G03F 7/0236* (2013.01); *G03F 7/0392* (2013.01);
(Continued)

(58) Field of Classification Search
CPC ...... H10K 30/82; H10K 50/81; H10K 50/828; H10K 71/00; H10K 71/621;
(Continued)

(56) References Cited

U.S. PATENT DOCUMENTS 9,419,152 B2    8/2016   Naito et al.
2010/0021708 A1   1/2010   Kong et al.
(Continued)

FOREIGN PATENT DOCUMENTS

CN    107651668 A    2/2018
CN    107765511 A    3/2018
(Continued)

OTHER PUBLICATIONS

International Search Report issued Apr. 21, 2020 in PCT/JP2020/008695 filed Mar. 2, 2020 (with English Translation of Categories of Cited Documents), 6 pages.

(Continued)

*Primary Examiner* — Mohammed R Alam
(74) *Attorney, Agent, or Firm* — Oblon, McClelland, Maier & Neustadt, L.L.P.

(57) ABSTRACT

The present embodiment provides a transparent electrode, a transparent electrode production process and a photoelectric conversion device. The transparent electrode comprises a patterned electrode layer formed on a transparent substrate. The electrode layer has an electroconductive film containing metal nanowires and also has a film of N-graphene. In the graphene carbon skeleton of the N-graphene, carbon atoms are partly substituted with nitrogen atoms. The transparent electrode can be produced by: forming an electroconductive layer by coating with a dispersion containing metal nanowires; then forming an N-graphene film thereon; and subsequently patterning them.

20 Claims, 3 Drawing Sheets

(51) Int. Cl.
   *G03F 7/039* (2006.01)
   *G03F 7/20* (2006.01)
   *G03F 7/32* (2006.01)
   *H10K 30/82* (2023.01)
   *H10K 50/81* (2023.01)
   *H10K 50/828* (2023.01)
   *H10K 71/00* (2023.01)
   *B82Y 40/00* (2011.01)
   *H10K 102/00* (2023.01)

(52) U.S. Cl.
   CPC ............ *G03F 7/2004* (2013.01); *G03F 7/322* (2013.01); *H10K 50/81* (2023.02); *H10K 50/828* (2023.02); *H10K 71/00* (2023.02); *H10K 71/621* (2023.02); *B82Y 40/00* (2013.01); *H10K 2102/00* (2023.02)

(58) Field of Classification Search
   CPC .............. H10K 2102/00; H10K 39/12; H10K 59/80517; H10K 59/80524; G03F 7/0236; G03F 7/0392; G03F 7/2004; G03F 7/322; B82Y 40/00; B82Y 30/00; Y02E 10/549; Y02P 70/50; H01B 5/14; H01B 13/00; H05B 33/28

See application file for complete search history.

(56) References Cited

U.S. PATENT DOCUMENTS

| | | |
|---|---|---|
| 2014/0287639 A1 | 9/2014 | Lee et al. |
| 2015/0144899 A1 | 5/2015 | Verilhac et al. |
| 2015/0369735 A1 | 12/2015 | Avouris et al. |
| 2019/0027622 A1* | 1/2019 | Shida .............. H01L 31/022483 |
| 2019/0341510 A1* | 11/2019 | Kim ................ H01L 31/022466 |
| 2020/0395491 A1 | 12/2020 | Naito et al. |
| 2021/0184127 A1 | 6/2021 | Naito et al. |

FOREIGN PATENT DOCUMENTS

| | | |
|---|---|---|
| CN | 109979642 A | 7/2019 |
| JP | 2013-209261 A | 10/2013 |
| JP | 2014-208469 A | 11/2014 |
| JP | 2017-217785 A | 12/2017 |
| JP | 2019-52083 A | 4/2019 |
| JP | WO 2021/048923 A | 3/2021 |
| KR | 10-2014-0037500 A | 3/2014 |
| KR | 10-2014-0091403 A | 7/2014 |
| KR | 10-2019-0020218 A | 2/2019 |
| KR | 10-2019-0099903 A | 8/2019 |

OTHER PUBLICATIONS

Combined Chinese Office Action and Search Report issued Jul. 18, 2024 in Chinese Application 202080017539.1, (with partial unedited computer-generated English translation), 9 pages.

* cited by examiner

TRANSPARENT ELECTRODE, PROCESS FOR PRODUCING TRANSPARENT ELECTRODE, AND PHOTOELECTRIC CONVERSION DEVICE COMPRISING TRANSPARENT ELECTRODE

CROSS REFERENCE TO RELATED APPLICATIONS

This application is based upon and claims the benefit of priority from the prior International Patent Application PCT/JP2020/008695, filed on Mar. 2, 2020, the entire contents of which are incorporated herein by reference.

FIELD

Embodiments of the present disclosure relate to a transparent electrode, a process for producing the transparent electrode and a photoelectric conversion device comprising the transparent electrode.

BACKGROUND

According to recent increasing of energy consumption, demand for alternative energy replacing fossil energy has been rising as measures to cope with global warming. As a source of the alternative energy, solar cells have been attracted the attention and hence progressively developed. They are studied for various practical applications. Solar cells are required to generate power efficiently. But not only that, it is also particularly important to improve their flexibility and durability so that they can be installed on various places. However, single crystal silicon solar cells, which are the most basic solar cells, are expensive and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic electroluminescence devices (hereinafter often referred to as "EL devices") and photosensors, have been also researched with the aim of improving their flexibility. The devices using organic materials can be produced by coating processes, and hence they are advantageous to comprise flexible polymer substrates, which are generally weak to heat. Further, electrodes in those devices are also preferably formable by coating processes. As materials for forming the electrodes, dispersions of metal nanomaterials are often employed. The metal nanomaterials are known to have various shapes, and those in nanowire shape are known to be usable for transparent electrodes. Specifically, nanowires of silver (including silver alloys) or copper (including copper alloys) can realize excellent transparency and low-resistance. When metal nanowires are adopted as a material of transparent electrodes in photoelectric conversion devices or the like, the electrode layers of metal nanowires must be subjected to patterning. However, if the patterning treatment is carried out by use of generally used photoresist, the electrode layer is often peeled off or impaired in the step of etching or removing the photoresist. Accordingly, it is desired to provide a means for preventing the troubles such as peeling-off. In addition, the electrodes comprising metal nanowires are liable to deteriorate even in producing or operating the devices, and hence it is also desired to prevent the deterioration.

DETAILED DESCRIPTION

The transparent electrode according to the embodiment, comprises
a patterned electrode layer formed on a transparent substrate, provided that said electrode layer has an electroconductive film containing metal nanowires and also has a protective film lying on said metal nanowires and containing N-graphene in which carbon atoms in the graphene carbon skeleton are partly substituted with nitrogen atoms.

Also, the process according to the embodiment for producing the transparent electrode, comprises the steps of:
(A) coating a transparent substrate with a dispersion containing metal nanowires and then drying the dispersion to form an electroconductive film,
(B) forming an N-graphene film on said electroconductive film,
(C) forming a photoresist film on said N-graphene film,
(D) exposing said photoresist film to light and then developing the exposed film to form a photoresist pattern,
(E) etching the area not masked with said pattern so as to remove the N-graphene film and the electro-conductive film in the part immediately under the area not masked with said pattern, and
(F) removing said photoresist pattern.

Further, the photoelectric conversion device according to the embodiment comprises the above transparent electrode, a photoelectric conversion layer, and a counter electrode.

The embodiments will be described below in detail.

Embodiment 1

The transparent electrode according to the first embodiment is explained with reference to FIG. 1.

Figure 1:
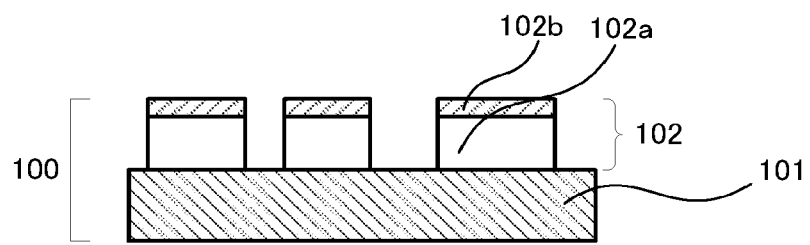
FIG. 1 is a schematic sectional view showing the structure of a transparent electrode according to one of the embodiments.

FIG. 1 shows a transparent electrode 100 comprising a transparent substrate 101 and a patterned electrode layer 102 formed thereon. The electrode layer 102 has a structure in which an electroconductive film 102a and a protective film 102b are stacked, and the electroconductive film 102a contains metal nanowires and the protective film 102b contains N-graphene in which carbon atoms in the graphene carbon skeleton are partly substituted with nitrogen atoms. The protective film is laid on the electro-conductive film and has a function of protecting the electroconductive film in the etching treatment as described later.

The electrode layer is patterned on the transparent substrate. Accordingly, the electrode layer is not evenly laid on the surface of the substrate but there are some areas where the electrode layer is absent. Accordingly, as shown in the sectional view of FIG. 1, the electrode layer is divided apart.

Specifically, there are some gaps in the electrode layer, and the gaps divide the electrode layer into some parts. The electrode layer thus seems to be separated into some parts when observed in a section, and those parts may be completely isolated or may be connected to each other through paths not seen in the section. This means that, when observed perpendicularly to the surface of the transparent substrate, the electrode layer may seem to be divided by a lattice-shaped space into many parts separately arranged.

The adopted pattern is thus capable of providing plural electrode layer parts which individually serve as electrodes and which are completely isolated and arranged on a single transparent substrate, and consequently it becomes possible to form independent plural elemental device structures individually corresponding to the electrodes. Accordingly, the pattern makes it easy to produce a device in which plural elemental devices are arranged in series or the like.

There are no particular restrictions on the transparent substrate as long as it transmits light and has enough transparency for the device. Specifically, for example, the transparent substrate is made of inorganic materials such as glass or organic materials such as polyethylene terephthalate (PET), polyethylene naphthalate (PEN), polycarbonate (PC) and polymethyl-methacrylate (PMMA). The transparent substrate may be made of plural materials. Preferred are flexible organic materials because the transparent electrode of the embodiment is suitable for a flexible device.

In the transparent electrode according to the embodiment, the upper part of the electroconductive film is covered with the N-graphene film. Because of this structure, the N-graphene layer serves as a protective film of the metal nanowire-containing electroconductive film so as to prevent the electroconductive film from peeling-off or deterioration when other elements are provided on the electrode to produce the device or when the produced device is operated.

In the embodiment, there are no particular restrictions on the metal contained in the metal nanowires. However, in view of electroconductivity and the like, the nanowires preferably comprise a metal selected from the group consisting of silver, silver alloys, copper and copper alloys, and it is particular preferred for the nanowires to comprise a silver alloy.

A plural number of the metal nanowires are partly fused or in contact with each other to form a mesh-shaped or lattice-shaped network structure, and consequently plural electroconductive paths are produced to constitute an electroconductive cluster massively connected (percolation conduction theory). For enhancing the conductivity of the electroconductive cluster, the nanowires preferably lie in high density. On the other hand, however, in order to obtain an electrode used in a device required to be transparent and flexible, the nanowire density is preferably below a certain level. Specifically, the coating amount of the nanowires is normally 0.05 to 50 g/m$^2$, preferably 0.1 to 10 g/m$^2$, more preferably 0.15 to 1 g/m$^2$. If the metal nanowires are laid in the above density range, the obtained electroconductive film can have enough transparency, flexibility and electroconductivity at the same time.

In the present embodiment, the metal nanowires are normally 10 to 500 nm in diameter and 0.1 to 50 μm in length. The longer the nanowires are, the more readily the conductive cluster is generally produced. In addition, the larger diameters the nanowires have, the larger the electroconductivity is. Thus, since the nanowires form a network structure, the nanowire-containing layer as a whole shows high electro-conductivity although containing the metal in a small amount.

If having too small diameters, the nanowires in themselves tend to have large electrical resistance. On the other hand, if the diameters are too large, it should be noticed that light-scattering or the like may increase to reduce the transparency. In view of avoiding those problems, the nanowires have diameters of preferably 10 to 500 nm, more preferably 20 to 150 nm, further preferably 30 to 120 nm.

If the nanowires have too short lengths, the conductive cluster may be formed so insufficiently that the resistance tends to increase. On the other hand, if they have too long lengths, it should be noticed that the nanowires are often unable to disperse stably in producing an electrode or the like. In view of avoiding those problems, the nanowires have lengths of preferably 0.1 to 50 μm, more preferably 1 to 40 μm, further preferably 5 to 30 μm. The diameters and lengths of the metal nanowires can be determined, for example, by analyzing a SEM image selected with a scanning electron microscope (SEM).

The metal nanowires can be produced in any manner. For example, silver nanowires can be obtained by reducing an aqueous solution of silver ions with various reducing agents. The shapes and sizes of the silver nanowires can be controlled by selecting the kinds of the reducing agent, protective polymer or dispersant, and coexistent ions. In producing silver nanowires, it is preferred to adopt a polyhydric alcohol, such as ethylene glycol, as the reducing agent and polyvinylpyrrolidone or derivatives thereof as the protective polymer. From those materials, what is called "nanowires" of nano-order size can be obtained.

The electroconductive film may consist of only the above-described nanowires, but may contain other substances, such as, polymers. According to the kind of polymers, they can function as a binder of the metal nanowires or can improve adhesion between the conductive film and the substrate so as to prevent the film from peeling-off. In that way, for example, adhesive polymers can be employed in the present embodiment. Examples of the adhesive polymers include polar group-introduced polyolefins, acrylic polymers and polyurethane polymers. However, if the conductive film contains the polymers or the like too much, they may lower the electroconductivity of the film. In view of that, the electroconductive film preferably contains substances other than the metal nanowires in small amounts. Specifically, the conductive film preferably contains the metal nanowires in an amount of 95 mass % or more based on the total mass of the film.

Further, the conductive film may contain electroconductive materials other than the metal nanowires, such as, metal nanoparticles and electroconductive oxide nanoparticles.

There are no particular restrictions on the thickness of the electroconductive film. For ensuring sufficient electroconductivity, the thickness is preferably large. On the other hand, however, for ensuring sufficient transparency, the film is preferably thinner than a certain thickness. In view of that, the electroconductive film has a thickness of preferably 50 to 500 nm, more preferably 100 to 300 nm.

The transparent electrode according to the present embodiment may have an adhesive layer provided between the electroconductive film and the transparent substrate. The adhesive layer can inhibit the conductive film from peeling off from the substrate, and can contain cross-linkable transparent polymers, such as, acrylic polymers, methacrylic polymers and epoxy resins.

In the present embodiment, the electrode layer has a N-graphene film lying on the above-described electroconductive film. The N-graphene here has a graphene carbon skeleton in which carbon atoms are partly substituted with nitrogen atoms. The N-graphene film can be formed by a coating method or a CVD method.

There are no particular restrictions on the thickness of the N-graphene film. For example, the film has a thickness of 2 to 50 Å, preferably 5 to 20 Å. The N-graphene film having such a thin thickness preferably has a layered structure comprising one to four monomolecular layers of graphene (hereinafter, referred to as "graphene monolayers") on average. It is surprising that the N-graphene film having such a thin thickness can protect electroconductivity. The nitrogen amount (N/C atomic ratio) in the N-graphene film can be determined by XPS, and is preferably 0.1 to 30 atom %, more preferably 1 to 10 atom %. The N-graphene layer has such high shielding effect that acids and halogen ions can be prevented from diffusing and thereby that the metal nanowires can be kept from deterioration.

Although having a relatively small metal content, the transparent electrode according to the present embodiment shows considerably high electroconductivity. Specifically, the transparent electrode layer has a surface resistance of preferably 20 Ω/square or less, more preferably 15 Ω/square or less.

Embodiment 2

Figure 2:
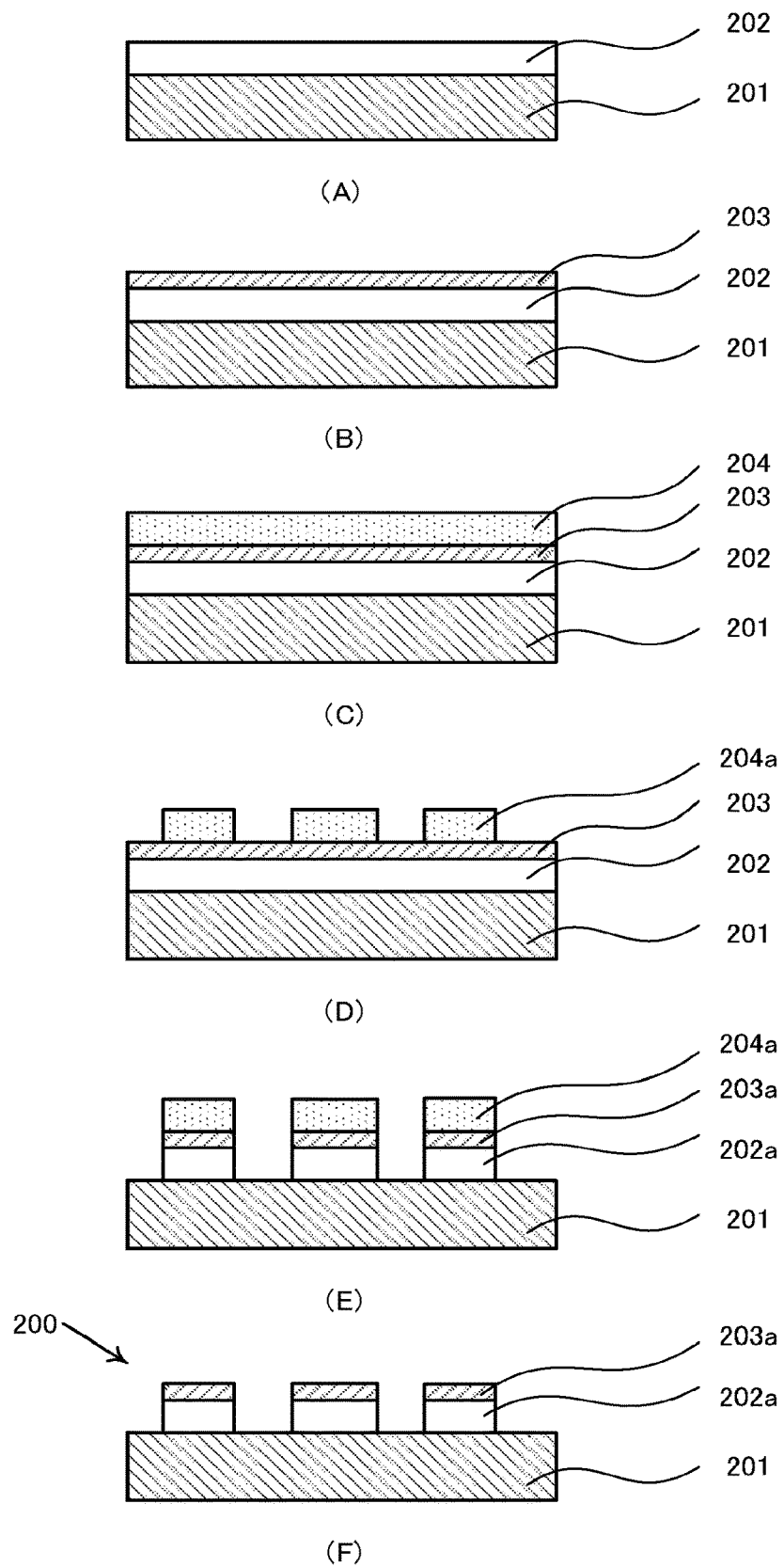
FIG. 2 shows schematic sectional views illustrating a transparent electrode production process according to one of the embodiments.

The transparent electrode production process according to the second embodiment is explained with reference to FIG. 2. FIG. 2 (A) to (F) are schematic sectional views illustrating the process for producing a transparent electrode 200. This electrode production process comprises the steps of:

(A) coating a transparent substrate 201 with a dispersion containing metal nanowires and then drying the dispersion to form an electroconductive film 202, (B) forming an N-graphene film 203 on said electroconductive film 202, (C) forming a photoresist film 204 on said N-graphene film 203, (D) exposing said photoresist film 204 to light and then developing the exposed film to form a photoresist pattern 204a, (E) etching the area not masked with said pattern 204a so as to remove the N-graphene film 203 and the electroconductive film 202 in the part immediately under the area not masked with said pattern, and (F) removing said photoresist pattern 204.

(Step (A))

First, a transparent substrate 201 is directly coated with a dispersion containing metal nanowires to form an electroconductive film 202.

As a method for coating the dispersion, for example, the dispersion is held between the substrate 201 and a coating bar placed parallel to and apart from the substrate and then the bar or the substrate is shifted (i.e., bar-coating method).

The gap between the substrate and the coating bar can be controlled according to the substrate material, the dispersion material and the kind of the coating bar. The dispersion may be supplied with a nozzle to the gap between the substrate and the coating bar, and the coating bar may also have the function of the nozzle.

The coating procedure can be carried out according to other methods, such as, brush coating method, spray coating method and dip coating method. Any coating method can be adopted depending on the objective. In a process according to the spray coating method, for example, plural fixed nozzles can be adopted or the nozzle can be moved in reciprocating motion so as to coat a large-scale area.

As the dispersing medium contained in the metal nanowire dispersion, water, alcohols and mixture thereof are employed. Among them, water is most preferred from the viewpoints of environment and cost. However, if the dispersing medium consists of only water, it is generally difficult to form an even coating layer on the hydrophobic substrate. In view of that, as the dispersing medium, it is preferred to adopt mixtures of water and organic solvents such as alcohols. Further, for easily conducting the coating procedure, the coating is preferably carried out by use of a spray instead of a nozzle while the hydrophobic substrate is heated at a high temperature.

If alcohols are adopted as the dispersing medium, the dispersion has a surface tension low enough to coat the hydrophobic substrate easily. The alcohols are preferably those evaporating at relatively low temperatures, and preferred examples thereof include methanol, ethanol, n-propanol, 2-propanol, n-butanol, and mixtures thereof. Also usable are mixed dispersing media of water and those alcohols. The dispersing medium may contain a dispersant. Examples of the dispersant include: polymer compounds, such as, polyvinylpyrrolidone, polyvinyl alcohol and derivatives thereof; and low molecular weight compounds, such as, t-butoxyethanol and diethyleneglycol mono-t-butyl ether.

The dispersing medium may contain metal nanoparticles. For example, the silver nanowire dispersion may contain silver nanoparticles. Silver nanowires and silver nanoparticles are apt to aggregate, and hence the nanoparticles function as adhesive to connect the nanowires each other closely. As a result, the silver nanoparticles have an action to reduce electric resistance of the electroconductive film.

After the electroconductive film 202 is formed, the dispersing medium can be partly or completely removed by a heating treatment or a decompression treatment, if necessary.

(Step (B))

Then, an N-graphene film 203 is formed on the surface of the electroconductive film 202 formed in the step A. The N-graphene film can be formed in any manner, but is preferably formed by a coating method. The coating method makes it easy to produce a large-area electrode and also to adopt a roll-to-roll technique.

Typically, the N-graphene film can be formed by: coating the electroconductive film with a dispersion containing a dispersion medium dispersing N-graphene in which carbon atoms in the graphene carbon skeleton are partly substituted with nitrogen atoms; and then, if necessary, drying the dispersion. The coating-type N-graphene film adopted here can be also produced, for example, from a film containing a graphene oxide substituted with alkyl chains or the like, in a manner where the graphene oxide film is reduced by adding therein a hydrazine or amine compound such as hydrazine hydrate.

As the dispersing medium contained in the graphene or N-graphene dispersion, various solvents, such as, water, alcohols, dimethylformamide, methyl ethyl ketone, chlorobenzene and mixture thereof, are employed. Among them, water is most preferred from the viewpoints of environment and cost.

It is also possible to form the N-graphene film by methods other than the coating method. For example, (i) the N-graphene film is formed on the surface of the electroconductive film by a chemical vapor deposition method from fundamental materials, such as methane and hydrogen, in combination with low-molecular weight nitrogen compounds, such as ammonia, pyridine, methylamine, ethylenediamine and urea;

(ii) the N-graphene film is formed on another substrate, and then transferred onto the electro-conductive film; or otherwise (iii) a non-substituted graphene film is formed on the electroconductive substrate, and then treated in nitrogen plasma to produce the N-graphene film.

(Step (C))

Subsequently, the surface of the N-graphene film 203 formed in the step (B) is coated with a photoresist to form a photoresist film 204. There are no particular restrictions on the photoresist used here, and any known material can be employed. However, since being directly in contact with the N-graphene film, the photoresist should be selected so as not to dissolve or damage the N-graphene film. The photoresist film can be also formed by laminating a sheet-shaped resist film onto the electrode layer.

(Step (D))

Thereafter, the formed photoresist film is fabricated by a lithographic technique or the like to form a pattern 204a. Specifically, the surface of the photoresist film is imagewise exposed to active energy rays, such as light and electron beams; then subjected to post-exposure bake, if necessary; and finally developed with a developer to form a resist pattern 204a.

(Step (E))

After the above, the resist pattern 204a formed in the step (D) is used as an etching mask for etching the metal nanowire layer 202 and the graphene layer 203, which are placed under the resist pattern 204a, with an etching solution. This etching treatment removes the N-graphene film and the electroconductive layer in the area not covered with the resist pattern, namely, in the part immediately under the area not masked with the pattern. Although the etching solution chemically acts on metal nanowires contained in the electroconductive layer 202, the N-graphene film 203 is as thin as 10 Å, for example, and hence is thin enough to be physically released. As a result, the shape of the resist pattern 204a is transferred onto the electroconductive layer 202 and the N-graphene film 203.

(Step (F))

Afterwards, the resist pattern 204a lying on the top surface of the pattern formed in the step (E) is removed with a resist removal solution, to form an electrode pattern in which the electroconductive layer 202a and the N-graphene film 203a are stacked.

In the manner described above, the transparent electrode according to the present embodiment can be produced.

Embodiment 3-1

The photoelectric conversion device (solar cell device) according to the third embodiment is explained with reference to FIG. 3.

Figure 3:
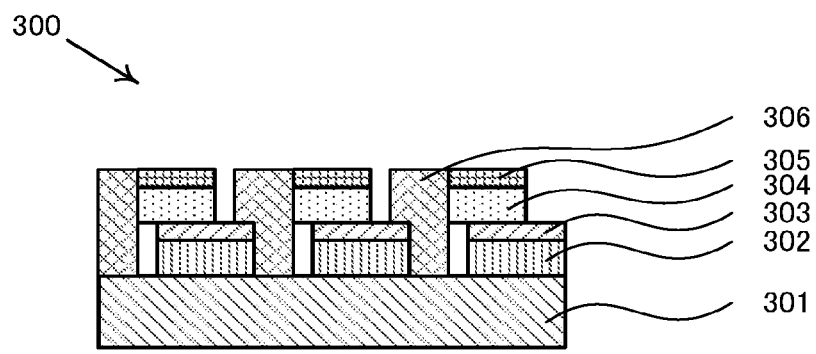
FIG. 3 is a schematic sectional view showing the structure of a photoelectric conversion device according to one of the embodiments.

FIG. 3 shows a photoelectric conversion device 300. In the conversion device 300, plural electrode layers comprising metal nanowire-containing electroconductive films 302 and N-graphene films 302 are laid on a transparent substrate 301 and they are separated from each other with spaces where neither silver nanowires nor graphene are present. On those electrode layers, photoelectric conversion layers 304 and counter electrodes 305 are provided. Each counter electrode 305 links to the transparent electrode of the adjacent cell with a bridge electrode 306, and thereby the cells are connected in series.

The photoelectric conversion device 300 functions as a solar cell in which incident photoenergy such as sunlight L coming to the cells is converted into electric power. If the sunlight L comes only from the transparent electrode side, the counter electrodes may be either transparent or not. If they are transparent, transparent electrodes according to the embodiment may be adopted as the counter electrodes.

The photoelectric conversion layers 304 are semiconductor layers that convert incident light energy into electric power to generate a current. Each conversion layer 304 generally comprises a p-type semiconductor sub-layer and an N-type semiconductor sub-layer. As the photoelectric conversion layer, it is also possible to use: a laminate of p-type polymer and n-type material; an inorganic semiconductor such as perovskite type represented by $ABX_3$ (in which A is a monovalent cation, B is a divalent cation and X is a halogen ion), silicon semiconductor, InGaAs, GaAsd, chalcopyrite type, CdTe type, InP type or SiGe type; and a transparent semiconductor such as quantum dots-containing type or dye sensitizing type. Any of the above has enough high efficiency to reduce deterioration of output power.

In order to promote or block charge injection, the device can further comprise buffer layers or the like between the conversion layers 304 and the electrode layers.

The buffer or charge transport layer for positive electrode may be, for example, a layer of vanadium oxide, PEDOT/PSS, P-type polymer, vanadium pentoxide ($V_2O_5$), 2,2',7,7'-tetrakis[N,N-di(4-methoxyphenyl)amino]-9,9'-spirobifluorene (Spiro-OMeTAD), nickel oxide (NiO), tungsten trioxide ($WO_3$) or molybdenum trioxide ($MoO_3$).

On the other hand, the buffer or charge transport layer for negative electrode may be, for example, a layer of lithium fluoride (LiF), calcium (Ca), 6,6'-phenyl-C61-butyric acid methyl ester (C60-PCBM), 6,6'-phenyl-C71-butyric acid methyl ester (hereinafter, referred to as "C70-PCBM"), indene-C60 bisadduct (ICBA), cesium carbonate ($Cs_2CO_3$), titanium dioxide ($TiO_2$), poly[(9,9-bis(3'-(N,N-dimethylamino)propyl)-2,7-fluorene)-alt-2,7-(9,9-di-octyl-fluorene)] (PFN), bathocuproine (BCP), zirconium oxide (ZrO), zinc oxide (ZnO), tin oxide (SnO) or polyethyneimine.

The photoelectric conversion device according to the present embodiment can be used not only as a photocell or a solar cell but also as a photosensor. The device can be applied to light selected from a wide wavelength range of infrared to ultraviolet or γ-rays.

The photoelectric conversion device according to the embodiment can further comprise a UV-cut layer or a gas-barrier layer. Examples of ultraviolet absorbers contained in the UV-cut layer include: benzophenones, such as, 2-hydroxy-4-methoxybenzophenone, 2,2-dihydroxy-4-methoxybenzophenone, 2-hydroxy-4-methoxy-2-carboxybenzophenone, and 2-hydroxy-4-n-octoxybenzophenone; benzotriazoles, such as, 2-(2-hydroxy-3,5-di-t-butylphenyl)benzotriazole, 2-(2-hydroxy-5-methylphenyl)benzotriazole, and 2-(2-hydroxy-5-t-octylphenyl)benzotriazole; and salicylic esters, such as, phenyl salicylate and p-octylphenyl salicylate. The absorbers are preferably capable of cutting UV light in the wavelength range of 400 nm or less.

The gas-barrier layer blocks preferably water vapor and oxygen, particularly preferably water vapor. This layer is preferably, for example, a film of inorganic substance such as SiN, $SiO_2$, SiC, $SiO_xN_y$, $TiO_2$ or $Al_2O_3$. Further, it may be an ultrathin glass sheet. There are no particular restrictions on the thickness of the gas-barrier layer, but the thickness is preferably 0.01 to 3000 μm, more preferably 0.1 to 100 μm. If it is less than 0.01 μm, the layer cannot serve fully as a barrier against gases. On the other hand, if the thickness is more than 3000 μm, the layer tends to be too thick to ensure flexibility or bendability. The gas-barrier layer has a water-vapor permeability (moisture permeability) of preferably $10^2$ to $10^{-6}$ g/m²·d, more preferably 10 to $10^{-5}$ g/m²·d, further preferably 1 to $10^{-4}$ g/m²·d. The moisture permeability can be measured according to JIS 20208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion-beam assisted deposition; sputtering processes, such as, reactive sputtering, ion beam sputtering, ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

Embodiment 3-2

Figure 4:
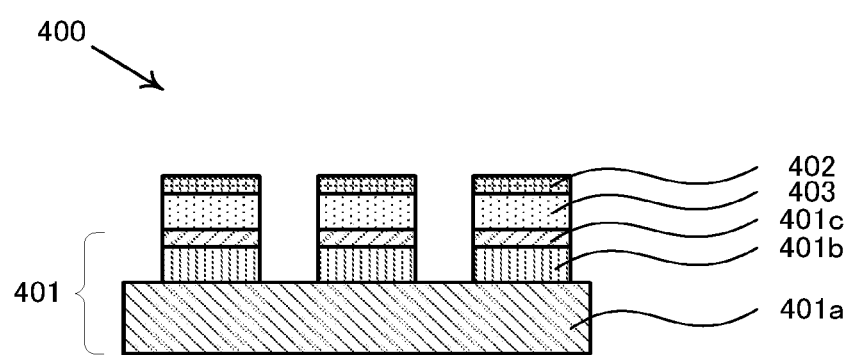
FIG. 4 is a schematic sectional view showing the structure of a photoelectric conversion device according to another of the embodiments.

With reference to FIG. 4, the structure of another photoelectric conversion device (organic EL device 400) produced according to the embodiment is schematically explained. The organic EL device 400 functions as a light-emitting device in which inputted electric energy is converted into light.

The organic EL device 400 has a transparent electrode 401 according to the embodiment, counter electrodes 402, and photoelectric conversion layers 403. The transparent electrode 401 comprises a transparent substrate 401*a*, electroconductive films 401*b* and N-graphene films 401*c*.

The photoelectric conversion layers 403 are semiconductor layers in which electric power is converted to generate light. Each conversion layer 403 generally comprises a p-type semiconductor layer and an n-type one. For the purpose of promoting or blocking electron injection, there may be buffer layers between the photoelectric conversion layers 403 and the electrode.

The transparent electrode according to the embodiment comprises an electrode layer so patterned as to serve as independent plural electrode layers shown in FIG. 4, and each of them independently supplies electric energy to each photoelectric conversion layer laid thereon. Thus, they enable the photoelectric conversion device to display an image.

The embodiments are further explained by the following examples.

Example 1

Silver nanowires having a diameter of 70 nm and a length of 15 μm are dispersed in water, to prepare a 0.3 mass % dispersion. Meanwhile, a PET film is coated with a PMMA film to prepare a transparent substrate. The PMMA film is then bar-coated with the above silver nanowire dispersion, to produce an electroconductive film having a sheet resistance of about 10 Ω/square.

The electroconductive film is bar-coated with an ethanol dispersion of N-graphene in which polyethylene-imine chains are connected, and then heated at 100° C. for 10 minutes.

After laminated on the N-graphene, a novolak-type photoresist film is patterned by light-exposure and development. The remaining photoresist is used as a mask in an etching treatment in which the electrode layer in the area immediately under the unmasked part of the electroconductive layer is removed with an acid. After washed with water, the resist serving as a mask is removed with an alkaline removal solution and washed with water to produce a transparent electrode shown in FIG. 1. The electroconductive part shows a sheet resistance of about 10 Ω/square, which is not changed. This indicates that the electrode layer is not damaged by patterning.

Comparative Example 1

The procedure of Example 1 is repeated except for omitting the step of forming the N-graphene film, to produce a transparent electrode. The electrode layer is observed to be peeled off and the electroconductivity is lost.

Comparative Example 2

The procedure of Example 1 is repeated except for employing graphene oxide in place of N-graphene, to produce a transparent electrode. The graphene oxide-containing film has a part where graphene is not oxidized and another part where the oxidation proceeds. In the transparent electrode of Comparative example 2, the electrode layer is observed to be partly peeled off and the electroconductivity is lowered.

Example 2

An N-graphene film is formed on a sheet of Cu foil from methane, hydrogen and ammonia gas by a thermal CVD method at 1000° C., then coated with a PMMA film, and thereafter the copper is dissolved with an acid.

Independently, silver nanowires having a diameter of 30 nm and a length of 8 μm are dispersed in water, to prepare a 0.3 mass % dispersion. The silver nanowire dispersion is then applied with a bar-coater on a PET film whose surface is beforehand cleaned with ethanol, to produce an electroconductive film having a sheet resistance of about 10 Ω/square.

The N-graphene/PMMA film is laminated on the electroconductive layer. Subsequently, the PMMA film is dissolved with ethyl acetate, to form a N-graphene layer on the silver nanowire-containing electroconductive film.

After laminated on the N-graphene, a photoresist film of novolak type is patterned by light-exposure and development. The remaining photoresist is used as a mask in an etching treatment in which the silver nanowires in the area immediately under the unmasked part is subjected to etching with an acid. The silver nanowires and the graphene lying thereon are removed by washing with water, to form separating areas. The residual resist is peeled away with an alkaline removal solution and washed with water to produce a transparent electrode shown in FIG. 1. The electroconductive part shows a sheet resistance of about 10 Ω/square, which is not changed.

Comparative Example 3

An unsubstituted graphene film is formed on a sheet of Cu foil from methane and hydrogen gas by a thermal CVD method at 1000° C., then coated with a PMMA film, and thereafter the copper is dissolved with an acid. The procedure of Example 2 is repeated except for adopting the formed unsubstituted graphene film, to produce a transparent electrode. The electrode layer is observed not to be apparently peeled off, but the electroconductivity is slightly lowered and the electro-conductive layer is partly impaired.

Example 3

A semitransparent solar cell shown in FIG. 3 is produced.

The transparent electrode obtained in Example 1 is bar-coated with an aqueous solution of PEDOT:PSS, and dried at 100° C. for 30 minutes to form a hole transport layer (thickness: 50 nm) containing PEDOT:PSS.

The hole transport layer is then bar-coated with a chlorobenzene solution containing poly(3-hexyl-thiophene-2,5-diyl) (P3HT) and C60-PCBM, and dried at 100° C. for 20 minutes to form a photoelectric conversion layer.

The photoelectric conversion layer is then bar-coated with an ethanol dispersion of tin oxide nanoparticles, and dried to form an electron transport layer.

Meanwhile, silver nanowires having a diameter of 70 nm are dispersed in water, to prepare a 0.3 mass % dispersion. The aqueous silver nanowire dispersion is spray-coated on a 10-cm square piece of polytetrafluoro-ethylene sheet of 100 μm thickness placed on a stage heated at 120° C., to form an electroconductive film.

The polytetrafluoroethylene sheet is so placed on a plate heated at 100° C. that the silver nanowire layer may be positioned on the upside. Subsequently, the transparent electrode is laid thereon so that the tin oxide-containing electron transport layer may be in contact with the silver nanowire layer, to form a stack. On the stack, a metal roller is then rolled from the edge so as to press-bond the stack. Successively, the sheet is peeled away to transfer the electroconductive film.

Subsequently, the films provided on the underlying layer where the separating areas are formed are mechanically scribed according to the separating areas. Thereafter, the section is coated with an insulating layer and then copper is sputtered to form a metal wiring layer so as to wire the strip-shaped cells in series.

The whole body is coated with a thermosetting silicone resin and heated to form an insulating layer of 40 μm thickness. On the insulating layer, UV-cut ink is screen-printed to form a UV-cut layer. The UV-cut layer is then coated by CVD with a silica layer to form a gas-barrier layer. Finally, the periphery is sealed to produce a solar cell module.

The obtained solar cell module is semitransparent, and shows an energy-conversion efficiency of 4% or more when irradiated with pseudo-sunlight of 1 SUN. Even after the solar cell module is continuously irradiated with the pseudo-sunlight for 1000 hours at 60° C. in the atmospheric air, the efficiency thereof deteriorates only by 2% or less.

The invention claimed is:

1. A transparent electrode comprising:
   a patterned electrode layer formed on a transparent substrate, provided that said electrode layer has an electroconductive film containing metal nanowires and also has a protective film containing N-graphene in which carbon atoms in the graphene carbon skeleton are partly substituted with nitrogen atoms and are connected with polyethylene-imine chains, wherein
   said protective film is lying on said electroconductive film and an upper part of the electroconductive film is covered with said N-graphene.

2. The transparent electrode according to claim 1, further comprising an adhesive layer between said transparent substrate and said electrode layer.

3. The transparent electrode according to claim 2, wherein said adhesive layer contains a cross-linkable transparent polymer.

4. The transparent electrode according to claim 1, wherein said electroconductive film contains an adhesive polymer.

5. The transparent electrode according to claim 1, wherein said electrode layer has a surface resistance of 20 Ω/square or less.

6. The transparent electrode according to claim 1, wherein said metal nanowires are nanowires of silver or a silver alloy.

7. The transparent electrode according to claim 1, wherein said transparent substrate is made of an organic material.

8. A process for producing a transparent electrode, comprising the steps of:
   (A) coating a transparent substrate with a dispersion containing metal nanowires and then drying the dispersion to form an electroconductive film;
   (B) forming a protective layer containing an N-graphene film which is connected with polyethylene-imine chains on said electroconductive film, wherein an upper part of the electroconductive film is covered with said N-graphene film;
   (C) forming a photoresist film on said N-graphene film;
   (D) exposing said photoresist film to light and then developing the exposed film to form a photoresist pattern;
   (E) etching an area not masked with said pattern so as to remove the N-graphene film and the electroconductive film in the part immediately under the area not masked with said pattern; and
   (F) removing said photoresist pattern.

9. The process according to claim 8, further comprising the step of
   (A') forming an adhesive layer on said transparent substrate before the step (A).

10. The process according to claim 8, wherein the step (B) includes a procedure of coating said electroconductive film with a dispersion containing graphene in which polyethylene-imine chains are connected.

11. The process according to claim 8, wherein the step (B) includes procedures of coating said electroconductive film with a dispersion containing graphene oxide and then of carrying out a reduction treatment with hydrazine hydrate.

12. The process according to claim 8, wherein the step (C) includes a procedure of laminating a resist film on said protective layer.

13. The process according to claim 8, wherein said photoresist film contains a novolak-type polymer.

14. The process according to claim 8, wherein the photoresist is removed in the step (F) by treating with an alkaline aqueous solution.

15. A photoelectric conversion device comprising: the transparent electrode according to claim 1, a photoelectric conversion layer, and a counter electrode.

16. The device according to claim 15, further comprising: a buffer layer which is positioned adjacent to said photoelectric conversion layer and which has an electronic function.

17. The device according to claim 15, wherein said counter electrode has light-transparency.

18. The device according to claim 15, wherein said counter electrode has a graphene layer.

19. The device according to claim 15, which is a solar cell.

20. The device according to claim 15, which is an organic electroluminescence device.

* * * * *